(12) United States Patent
Lee et al.

(10) Patent No.: US 6,190,954 B1
(45) Date of Patent: Feb. 20, 2001

(54) ROBUST LATCHUP-IMMUNE CMOS STRUCTURE

(75) Inventors: Jian-Hsing Lee; Shui-Hung Chen; Jiaw Ren Shih, all of Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/229,381

(22) Filed: Jan. 11, 1999

(51) Int. Cl.[7] ............................................. H01L 21/8238
(52) U.S. Cl. ........................... 438/199; 257/371; 257/372
(58) Field of Search ................................ 257/371, 369, 257/372; 438/199, 223, 224, 227, 228, 229, 231

(56) References Cited

U.S. PATENT DOCUMENTS

| | | | |
|---|---|---|---|
| 5,138,420 | 8/1992 | Komori et al. | 357/42 |
| 5,563,438 | 10/1996 | Tsang | 257/355 |
| 5,675,170 | 10/1997 | Kim | 257/373 |
| 5,831,313 * | 11/1998 | Han et al. | 257/371 |
| 5,956,591 * | 9/1999 | Fulford, Jr. | 438/305 |
| 5,966,598 * | 10/1999 | Yamazaki | 438/221 |

OTHER PUBLICATIONS

Wolf, "Silicon Processing for the ULSI Era", vol. 2, Lattice Press, 1990, pp. 400–413.
Wolf, "Silicon Processing for the VLSI Era", vol. 3, Lattice Press, 1995, pp. 406–413.

* cited by examiner

Primary Examiner—David Nelms
Assistant Examiner—David Vu
(74) Attorney, Agent, or Firm—George O. Saile; Stephen B. Ackerman

(57) ABSTRACT

A method is disclosed to provide for more robust latchup-immune CMOS transistors by increasing the breakover voltage $V_{BO}$, or trigger point, of the parasitic npn and pnp transistors present in CMOS structures. These goals have been achieved by adding a barrier layer to both the n-well and p-well of a twin-well CMOS structure, thus increasing the energy gap for electrons and holes of the parasitic npn and pnp transistor, respectively.

10 Claims, 6 Drawing Sheets

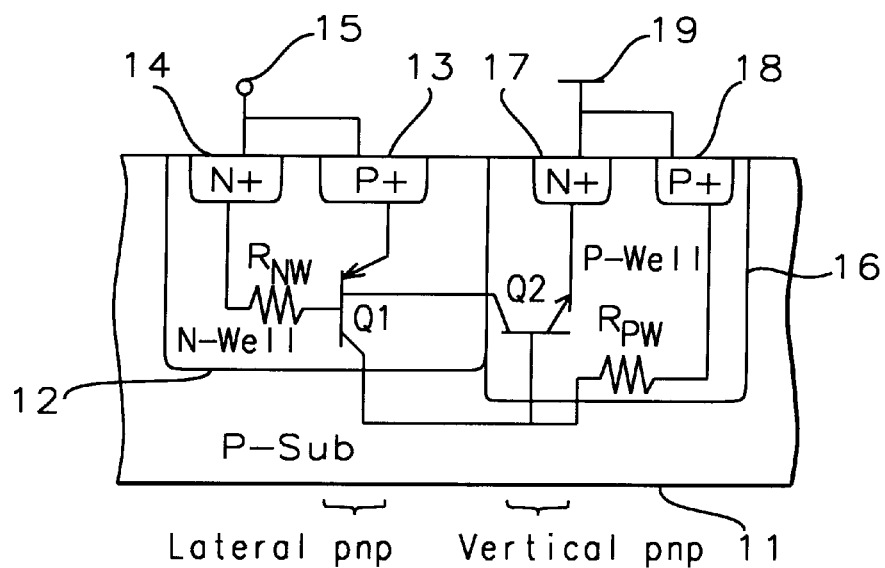
*FIG. 1 - Prior Art*
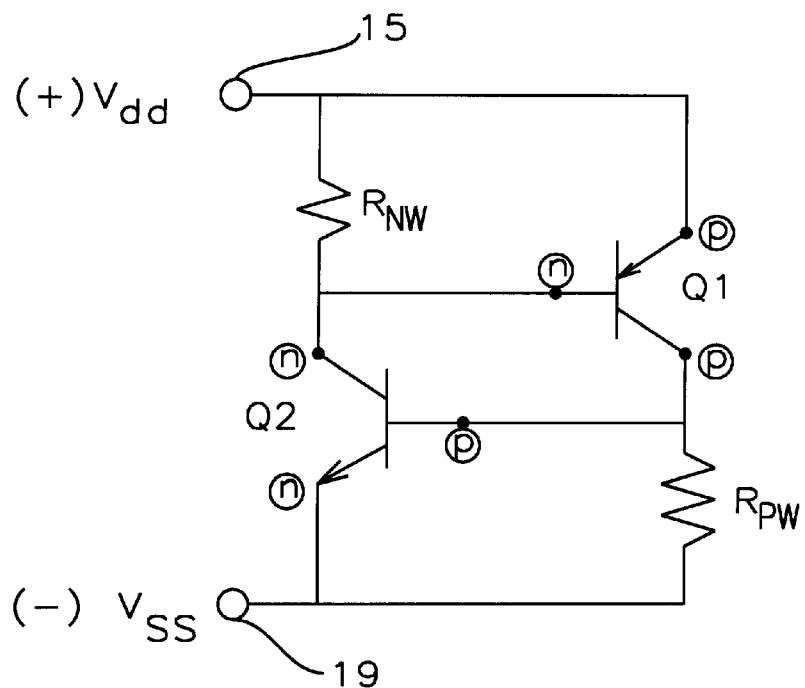
*FIG. 2 - Prior Art*

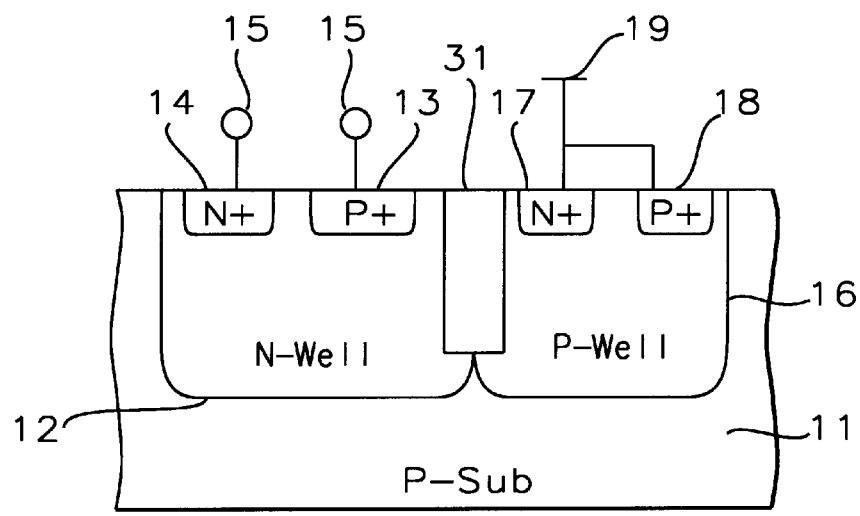
FIG. 3a – Prior Art
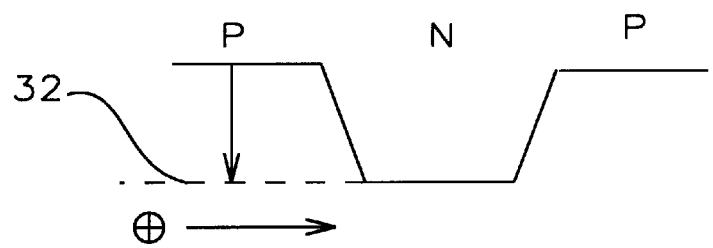
FIG. 3b – Prior Art
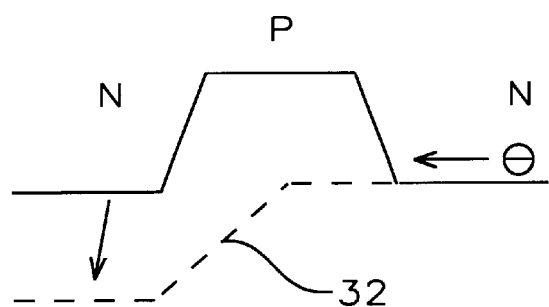
FIG. 3c – Prior Art

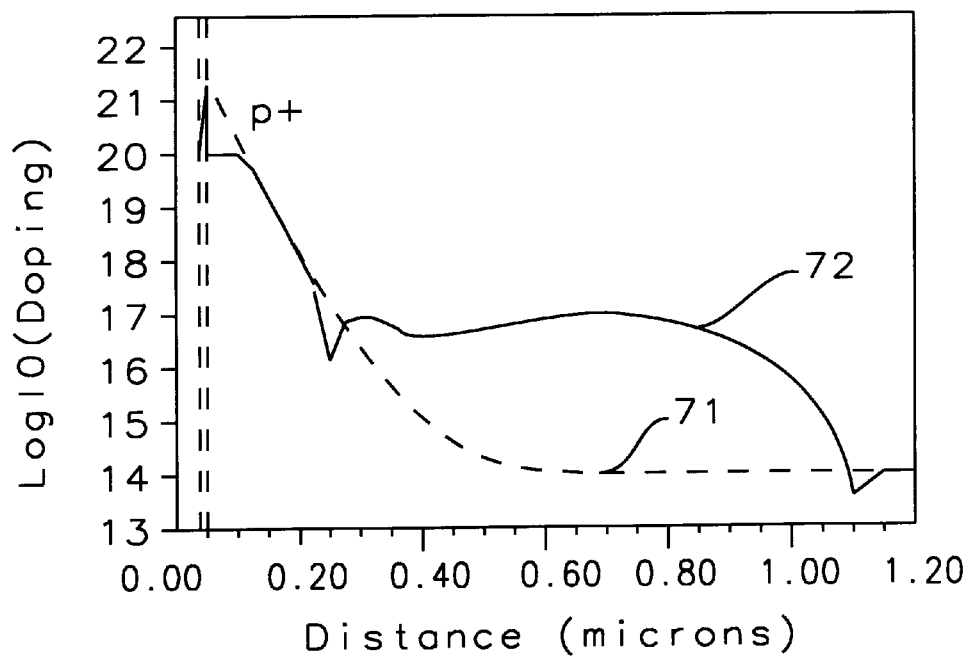
FIG. 7 - Prior Art
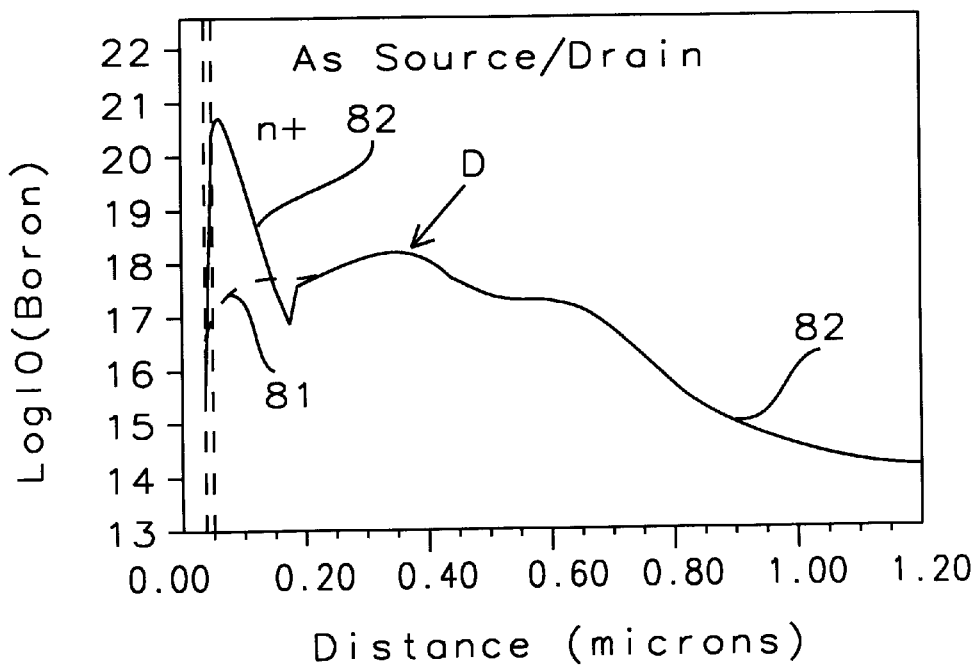
FIG. 8

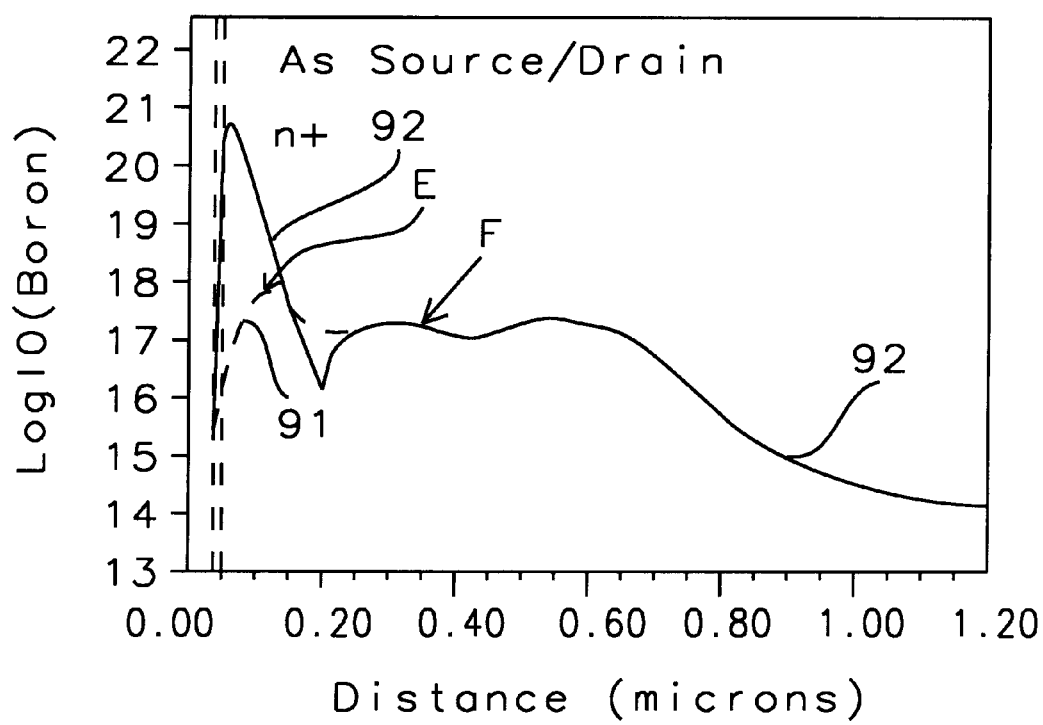
FIG. 9 — Prior Art

ROBUST LATCHUP-IMMUNE CMOS STRUCTURE

BACKGROUND OF THE INVENTION

1. Field of the Invention

The invention relates to methods of fabricating integrated CMOS circuits, and more particularly to making a CMOS twin-well integrated circuit more immune to latchup due to parasitic transistors.

2. Description of the Related Art

Latchup is a phenomenon of CMOS circuits and is well described by S. Wolf in *Silicon Processing for the VLSI Era*, Volume 2, by Lattice Press, copyright 1990, 6.4 LATCHUP IN CMOS, page 400: "A major problem in CMOS circuits is the inherent, self-destructive phenomenon known as latchup. Latchup is a phenomenon that establishes a very low-resistance path between the $V_{DD}$ and $V_{SS}$ power lines, allowing large currents to flow through the circuit. This can cause the circuit to cease functioning or even to destroy itself (due to heat damage caused by high power dissipation).

The susceptibility to latchup arises from the presence of complementary parasitic bipolar transistor structures, which result from the fabrication of the complementary MOS devices in CMOS structures. Since they are in close proximity to one another, the complementary bipolar structures can interact electrically to form device structures which behave like pnpn diodes."

FIG. 1 shows a cross-sectional view of a twin-well CMOS arrangement in a p-substrate 11 with an n-well 12, having a $p^+$ source 13 connected to an $n^+$ pad 14, 13 and 14 connected to a supply voltage 15 (+)$V_{dd}$, and a p-well 16 showing an $n^+$ source 17 connected to a $p^+$ pad 18, 17 and 18 connected to a reference voltage (−)$V_{ss}$, typically ground. The drain of the p-channel (PMOS) transistor in n-well 12 is not shown nor is shown the drain of the n-channel (NMOS) transistor in p-well 16. Q1 is a lateral pnp parasitic transistor structure and Q2 is a vertical npn parasitic transistor structure which results from the arrangement of NMOS and PMOS transistors. The lateral transistor Q1 comprises the source 13 of the PMOS transistor (emitter), n-well 12 (base), and p-substrate 11 (collector). The vertical transistor Q2 comprises source 17 of the NMOS transistor (emitter), p-well 16 (base), and n-well 12 (collector). N-well current flows from 15 (+)$V_{dd}$ through n-well 12 having a resistance $R_{NW}$, to the collector of Q2. P-well current flows from the collector of Q1 through p-substrate 11, through p-well 16, 16 having resistance $R_{PW}$, to 19 (−)$V_{ss}$.

FIG. 2, is an equivalent circuit diagram of the parasitic transistors of FIG. 1. The region of each transistor terminal is identified by a circle with an "n" or a "p". In this circuit the base of each transistor is connected to the collector of the other transistor. Inspection of FIG. 2 shows that this circuit is the equivalent of a parasitic pnpn diode (from emitter of Q1 to emitter of Q2). A pnpn diode below a certain "trigger" voltage acts as a high impedance, but when biased beyond that "trigger" voltage will act as a low impedance device similar to a forward biased diode. This results in a current that depends on $R_{NW}$ and $R_{PW}$ and can be destructive to the CMOS circuit.

FIG. 3a shows the same arrangement as that of FIG. 1, where like numerals indicate like members, except that a trench 31 between n-well 12 and p-well 16 was added as a means of implementing $n^+$-to-$p^+$ isolation structures primarily for achieving smaller interwell ($n^+$-to-$p^+$) isolation spacing. Deep trenches were also expected to solve or reduce latchup problems, however, they have not been as successful as hoped. Refer to S. Wolf in *Silicon Processing for the VLSI Era*, Volume 3, by Lattice Press, copyright 1995, 6.6.7 Trench Isolation for CMOS.

FIG. 3b and FIG. 3c show the standard energy band diagram for a pnp and npn transistor, respectively, as relating to the parasitic transistors Q1 and Q2 of FIGS. 1 and 2, where Curve 32 indicates the intrinsic Fermi level $E_i$.

Many workers have tackled the problem of latchup with various degrees of success, but the problem of latchup keeps on surfacing as transistor dimensions shrink to quarter and sub-quarter micron dimensions, because of the reduced well depth and inter-well spacing.

U.S. Pat. No. 5,675,170 (Kim) shows an n-well guard ring to interrupt the movement of minority carriers from the drain of an n-channel transistor to the n+pickup region of a p-channel transistor, thus preventing latchup.

U.S. Pat. No. 5,563,438 (Tsang) teaches the use of a third region adjacent to the drain region on the opposite side of the source. This third region is doped to have a polarity opposite to that of the drain and forms in combination with the drain an output protect diode, rendering the transistor relatively free of latchup.

U.S. Pat. No. 5,138,420 (Komori et al.) discloses the use of a $p^+$ deep well trench between an n-well and a p-well to prevent latchup.

It should be noted that none of the above-cited examples of the related art offer the simplicity and ease of providing a robust latchup-immune CMOS structure as does the proposed invention which will be discussed in detail in the Description of the Preferred Embodiment.

SUMMARY OF THE INVENTION

It is an object of the present invention to provide a method for a more robust latchup-immune integrated circuit structure.

Another object of the present invention is to provide a method to increase the breakover voltage $V_{BO}$, or trigger point, of the parasitic npn and pnp transistors present in a CMOS structure.

These objects have been achieved by adding a barrier layer to the n-well and p-well of a twin-well CMOS structure, thus increasing the energy gap for both electrons and holes of the parasitic npn and pnp transistors, respectively.

BRIEF DESCRIPTION OF THE DRAWINGS

FIG. 1 is a cross-sectional view of a twin-well CMOS structure of the prior art with parasitic bipolar transistors shown schematically.

FIG. 2 is an equivalent circuit diagram of the parasitic bipolar transistors of FIG. 1.

FIG. 3a is another cross-sectional view of a twin-well CMOS structure of the prior art but showing a trench separating the twin-well CMOS structure.

FIG. 3b is an energy band diagram of a conventional pnp transistor.

FIG. 3c is an energy band diagram of a conventional npn transistor.

FIG. 7 is an n-well profile with without barrier well implant of the prior art.

FIG. 8 is a p-well profile with barrier well implant of the present invention.

FIG. 9 is a p-well profile with without barrier well implant of the prior art.

DESCRIPTION OF THE PREFERRED EMBODIMENT

Figure 4A:
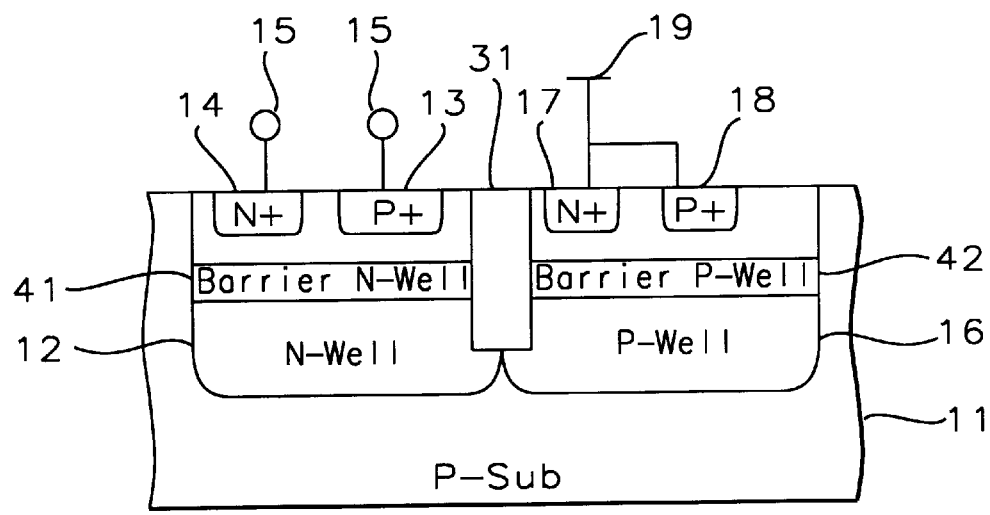
FIG. 4a is cross-sectional view of the present invention showing a twin-well CMOS structure with trench and a barrier well implant into both n-well and p-well.

Referring to FIG. 4a, we now describe a method of providing a robust latchup-immune MOSFET structure:

provide a p-type silicon substrate 11;

provide an n-well 12 and a p-well 16 in p-type substrate 11;

deposit a p-well barrier 42 in p-well 16;

deposit an n-well barrier 41 in n-well 12;

create a p-channel MOSFET transistor in n-well 12;

create an n-channel MOSFET transistor in p-well 16;

provide $p^+$ source 13 of the p-channel transistor with a connection to voltage supply 15 ($V_{dd}$) through $n^+$ pad 14 adjacent to $p^+$ source 13; and provide $n^+$ source 17 of the n-channel transistor with a connection to reference potential 19 through $p^+$ pad 18 adjacent to $n^+$ source 17.

Only sources 13 and 17 of the p-channel and n-channel transistor, respectively, are shown in FIG. 4a. The drains, gates, and other structural details of the transistors have been omitted being of typical construction and well understood by those skilled in the art.

Figure 4B:
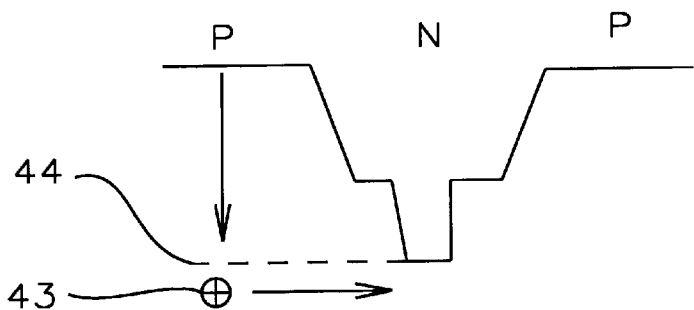
FIG. 4b is the modified energy band diagram of the parasitic pnp transistor resulting from the present invention.
Figure 4C:
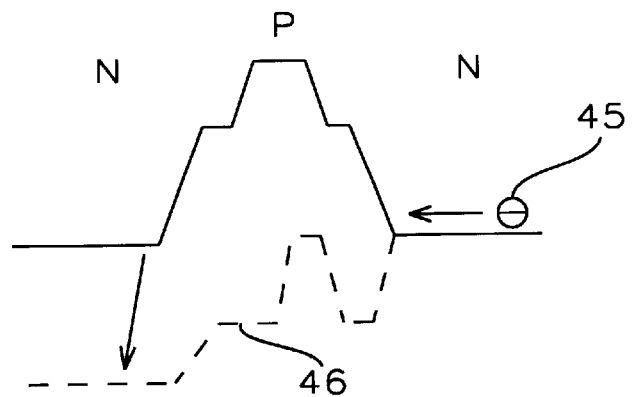
FIG. 4c is the modified energy band diagram of the parasitic npn transistor resulting from the present invention.

We now direct attention, in FIGS. 4b and 4c, to the energy band diagram of the parasitic pnp and npn transistor, respectively,—please refer to parasitic transistors Q1 and Q2 of FIGS. 1 and 2 as their arrangement still applies to FIG. 4a. The introduction of barrier n-well 41 into n-well 12 has modified the pnp energy band diagram so that it takes more energy for holes 43 to traverse the n-channel than in the prior art as illustrated in FIG. 3b. Curve 44 of FIG. 4b indicates the intrinsic Fermi level $E_i$ for the pnp parasitic transistor.

Similarly, the introduction of barrier p-well 42 into p-well 16 has modified the npn energy band diagram so that it takes more energy for electrons 45 to traverse the p-channel than in the prior art as illustrated in FIG. 3c. Curve 46 of FIG. 4c indicates the intrinsic Fermi level $E_i$ for the npn parasitic transistor. The overall effect of the increased energy gap is to make n-channel and p-channel transistors of the invention more immune to latchup.

Referring once again to FIG. 4a, the process for manufacturing the present invention calls for doping of p-well barrier 42 with an element of Group III of the Periodic Table, such as boron or boron difluoride and implanting with a concentration ranging from $10^{13}$ to $10^{15}$ atoms/cm$^2$ and with an energy ranging from 50 to 200 keV. The p-well barrier has a thickness ranging from 50 to 250 nm.

The process continues with the doping of n-well barrier 41 with an element of Group V of the Periodic Table, such as phosphorus or arsenic and implanting with a concentration ranging from $10^{13}$ to $10^{15}$ atoms/cm$^2$ and with an energy ranging from 250 to 400 keV. The n-well barrier has a thickness ranging from 50 to 250 nm.

Still referring to FIG. 4a, P-well barrier 42 is located between the bottom of p-well 16 and the n-channel transistor. Likewise n-well barrier 41 is located between the bottom of n-well 12 and the p-channel transistor. In addition p-well 16 and n-well 12 well are separated by trench 31.

Figure 5:
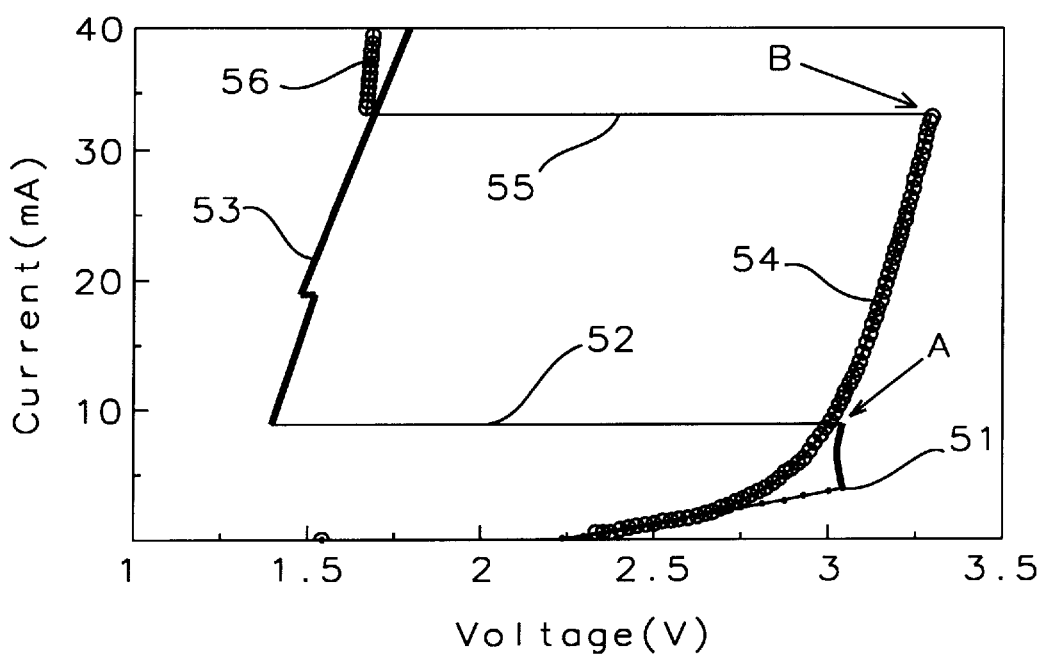
FIG. 5 is a graph of the I-V characteristics of the parasitic bipolar transistors of the present invention and of the prior art.

Referring now to FIG. 5, the graph displays the I-V characteristics of a pnpn diode of the prior art (made up of Curve 51, 52, and 53) and of the present invention (made up of Curve 54, 55, and 56) where the voltage on the x-axis is the voltage drop from the anode to the cathode of the pnpn diode, and the current on the y-axis is the corresponding current flow through the diode. The introduction of the barrier wells has raised the breakover voltage $V_{BO}$, or trigger point, (Point A of FIG. 5) of the parasitic pnpn diode (the combination of a pnp and npn bipolar transistor) in the MOSFET circuit from typically 3.1 Volt for the prior art, to typically 3.15 Volt, but ranging from 3 to 3.25 Volt for the present invention (Point B of FIG. 5). Similarly, the current for Point A of the prior art is typically 9 mA, while the trigger point current (Point B) for the present invention is typically 33 mA, but ranging from 30 to 35 mA. A higher voltage trigger point is clearly very advantageous because it is less likely that the pnpn diode will switch from the fairly high impedance state (Curve 54) to the low impedance state (Curve 56). A higher current associated with Point B is also of great advantage, because if the external circuit cannot provide the necessary holding current, the CMOS circuit will not stay latched up. It is clearly more likely that a given circuit could provide 9 mA than the approximately 33 mA of the present invention.

Figure 6:
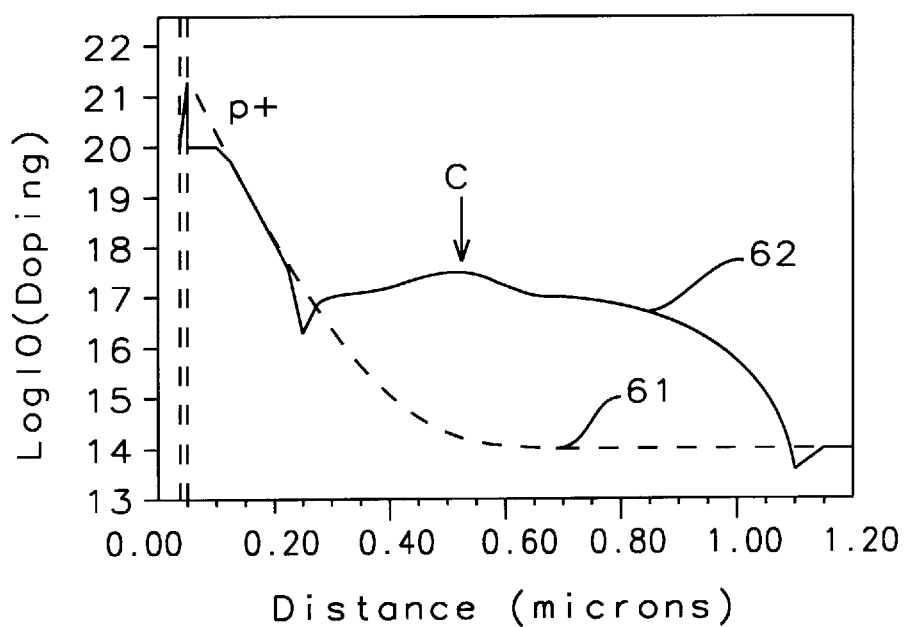
FIG. 6 is an n-well profile with barrier well implant of the present invention.

FIG. 6 is an n-well profile with barrier well implants comparing the doping concentration vs. junction depth of n-well 12, where Curve 61 represents the concentration of boron ($p^+$) for the source-drain, and Curve 62 represents the concentration of phosphorus or arsenic for the n-well. Point C, the hump in Curve 62, is caused by the barrier n-well 41.

FIG. 7 is an n-well profile without a barrier well implant, where Curve 71 is like Curve 61 of FIG. 6. Note, however, that Curve 72, representing the concentration of phosphorus or arsenic for the n-well, is without a hump, indicating a much lower concentration of dopants in that region.

FIG. 8 is a p-well profile with barrier well implants comparing the doping concentration vs. junction depth of p-well 16, where Curve 81 represents the concentration of arsenic ($n^+$) for the source-drain, and Curve 82 represents the concentration of boron for the p-well. Point D, the hump in Curve 82, is caused by the barrier p-well 42 due to increased doping.

FIG. 9 is a conventional p-well profile without a barrier well implant, where Curve 91 represents the concentration of boron for the p-well. Note that Curve 92, representing the concentration of boron for the p-well, is without a hump, indicating a much lower concentration of dopants in that region. The hump indicated by Point E on Curve 91 is caused by the p-well dopant when no $n^+$ doping is present. The hump indicated by Point F on that section where Curves 91 and 92 merge is caused by the p-well dopant and the presence of $n^+$.

Advantages of the present invention are the increased latchup voltage and current, thereby significantly reducing the danger of latchup and allowing a reduction of the well pick-up area.

While the invention has been particularly shown and described with reference to the preferred embodiments thereof, it will be understood by those skilled in the art that various changes in form and details may be made without departing from the spirit and scope of the invention.

What is claimed is:

1. A method of providing a robust latchup-immune MOSFET structure, comprising the steps of:
   providing a p-type silicon substrate;
   providing a p-well in said p-type substrate;
   providing an n-well in said p-type substrate;
   depositing a p-well barrier in said p-well, said p-well barrier having a thickness ranging from 50 to 250 nm;
   depositing an n-well barrier in said n-well, said n-well barrier having a thickness ranging from 50 to 250 nm;
   creating a p-channel MOSFET transistor in said n-well;
   creating an n-channel MOSFET transistor in said p-well;
   providing said p-channel transistor with a connection to a voltage supply; and
   providing said n-channel transistor with a connection to a reference potential.

2. The method of claim 1, wherein said p-well barrier is doped with an element of Group III of the Periodic Table, such as boron or boron difluoride.

3. The method of claim 2, wherein said element of Group III is implanted with a concentration ranging from $10^{13}$ to $10^{15}$ atoms/cm$^2$.

4. The method of claim 2, wherein said element of Group III is implanted with an energy ranging from 50 to 200 keV.

5. The method of claim 1, wherein said n-well barrier is doped with an element of Group V of the Periodic Table, such as phosphorus or arsenic.

6. The method of claim 5, wherein said element of Group V is implanted with a concentration ranging from $10^{13}$ to $10^{15}$ atoms/cm$^2$.

7. The method of claim 5, wherein said element of Group V is implanted with an energy ranging from 250 to 400 keV.

8. The method of claim 1, wherein said p-well barrier is located between the bottom of said p-well and said n-channel transistor.

9. The method of claim 1, wherein said n-well barrier is located between the bottom of said n-well and said p-channel transistor.

10. The method of claim 1, wherein said p-well and said n-well are separated by a trench.

* * * * *